US007188328B2

(12) United States Patent
Sharma et al.

(10) Patent No.: US 7,188,328 B2
(45) Date of Patent: Mar. 6, 2007

(54) METHOD FOR FINDING MAXIMUM VOLUME AND MINIMUM CUT IN A NETWORK OF INTERCONNECTED NODES

(75) Inventors: Sunil Kumar Sharma, Noida (IN); Ajay Tomar, Noida (IN); Dhabalendu Samanta, Delhi (IN)

(73) Assignee: STMicroelectronics Pvt Ltd., Uttar Pradesh (IN)

( * ) Notice: Subject to any disclaimer, the term of this patent is extended or adjusted under 35 U.S.C. 154(b) by 380 days.

(21) Appl. No.: 10/928,627

(22) Filed: Aug. 27, 2004

(65) Prior Publication Data
US 2005/0235236 A1  Oct. 20, 2005

(30) Foreign Application Priority Data
Aug. 29, 2003  (IN)  ............ 1073/Del/2003

(51) Int. Cl.
*G06F 17/50* (2006.01)
(52) U.S. Cl. ....................................... 716/7
(58) Field of Classification Search ............. 716/7
See application file for complete search history.

(56) References Cited
U.S. PATENT DOCUMENTS 5,257,201 A * 10/1993 Berman et al. ............. 716/2
5,930,499 A *  7/1999 Chen et al. ................ 716/8
6,219,823 B1 *  4/2001 Hama et al. .............. 716/12

OTHER PUBLICATIONS

Cong et al., Beyond The Combinatorial Limit In Depth Minimization For LUT-Based FPGA Designs, IEEE/ACM International Conference on Computer-Aided Design (ICCAD), Nov. 1993.
Francis et al., Chortle: A Technology Mapping Program For Lookup Table-Based Field Programmable Gate Arrays, Proc. 27th ACM/IEEE Design Automation Conference, pp. 613-619, Jun. 1990.
Cong et al., Flow-map: An Optimal Technology Mapping Algorithm For Delay Optimization In Lookup-Table Based FPGA Designs, IEEE Transactions on Computer-Aided Design of Intergrated Circuits and Systems CAD, vol. 13, pp. 1-12, Jan. 1994.
Cong et al., On Area/Depth Trade-off In LUT-Based FPGA Technology Mapping, 30th ACM/IEEE Design Automation Conference (DAC), pp. 213-218, 1993.

* cited by examiner

*Primary Examiner*—Vuthe Siek
*Assistant Examiner*—Brandon Bowers
(74) *Attorney, Agent, or Firm*—Lisa K. Jorgenson; Allen, Dyer, Doppelt, Milbrath & Gilchrist, P.A.

(57) ABSTRACT

A method for finding a maximum volume and minimum cutset in a network of interconnected nodes is provided. The method is applicable to systems that can be reduced to such a network, including telecommunication networks, traffic networks, computer networks, layouts, hydraulic networks, etc. An equivalent network is derived by replacing all nodes other then the source and sink by two interconnected nodes. A conventional method applies an augmenting path algorithm that identifies a cutset. If the feasible cutset is not achieved then a reduced network is constructed by directly connecting the member nodes of identified cutsets to the source node and repeating the above process for the reduced network until a feasible cutset is achieved.

2 Claims, 3 Drawing Sheets

METHOD FOR FINDING MAXIMUM VOLUME AND MINIMUM CUT IN A NETWORK OF INTERCONNECTED NODES

FIELD OF THE INVENTION

The present invention relates to an improved method for finding a maximum volume and minimum cut in a network of interconnected nodes, and more particularly, to optimally packing the nodes in a look-up table (LUT) while insuring minimum delay.

The invention described below is applicable to any network of interconnected nodes and is applicable to any system including telecommunication systems, traffic systems, computer networks, layouts, hydraulic systems, etc., that can be reduced to a network of interconnected nodes. The invention is being described herein with respect to an example that is applicable to a programmable logic array (PLA).

BACKGROUND OF THE INVENTION

A digital circuit includes basic electronic circuits forming different digital components including logic gates, registers, etc. These digital components are interconnected to provide a circuit that operates in a desired fashion. A programmable logic array (PLA) has a plurality of such digital circuits that are mapped over logic elements to form an efficient and flexible device. An important objective during mapping an electrical circuit over a PLA is to map a maximum number of circuit elements over a single logic element, and to achieve a smallest possible network of logic elements to form the electrical circuit while insuring the minimum possible delay.

For mapping a digital circuit on a logic element the digital circuit is converted into a network of a plurality of interconnected nodes having termination nodes labeled as sources (s) and sinks (t). The nodes represent a generalized digital component of the digital circuit. Two nodes are interconnected by at least an edge. Each edge is assigned a capacity $C_{ij}$ that represents the amount of flow through the edge. The capacity $C_{ij}$ represents capacity of the edge connecting $i^{th}$ node to $j^{th}$ node.

Further, a residual network can be produced by introducing a residual edge between two interconnected nodes in the original network. The residual capacity of the residual edge can then be defined as an amount of additional net flow that can be pushed across two nodes without exceeding the capacity $C_{ij}$ of the edge connecting these nodes in the original network. The network is then mapped over the logic element using a logic algorithm.

An augmenting path algorithm is one of the commonly used algorithms to find all distinct paths in the network. According to the algorithm, an augmented path is a directed path from the source to the sink in the residual network such that every arc on this path has a strictly positive residual capacity. The minimum of these residual capacities is called the residual capacity of the augmenting path because it represents the amount of flow that can feasibly be added to the entire path. A mathematical derivation, proof and examples of the augmenting path algorithm are available in general textbooks/research papers relating to the subject matter.

Various technologies propose different methods for mapping a digital circuit on a logic element. For example, a polynomial time technology mapping algorithm has been proposed by Chen et. al., "Flow-map: An Optimal Technology Mapping Algorithm For Delay Optimization In Lookup-Table Based FPGA Designs," IEEE Transactions on Computer-Aided Design of Integrated Circuits and Systems CAD, vol. 13, pp. 1–12, January 1994, in which a Flow-Map optimally maps electrical circuits on a FPGA for depth minimization by computing a minimum height for k-feasible cut a network. This algorithm is commonly used for technology mapping.

In another research article by Cong et. al., "On Area/Depth Trade-off In LUT-Based FPGA Technology Mapping," in 30th ACM/IEEE Design Automation Conference (DAC), pp. 213–218, 1993, an algorithm for FPGA mapping technology is disclosed. In this technique a number of depth relaxation operations are performed to obtain a new network with bounded increases in depth. This is advantageous to a subsequent re-mapping for area minimization by gradually increasing depth.

An integrated approach for synthesizing and mapping has been disclosed by Cong et al., "Beyond The Combinatorial Limit In Depth Minimization For LUT-Based FPGA Designs," in IEEE/ACM International Conference on Computer-Aided Design (ICCAD), pp. 110–114, November 1993. This algorithm uses global combinatorial optimization techniques to guide the Boolean synthesis process during depth minimization. The combinatorial optimization is achieved by computing a series of minimum cuts of fixed heights in a network based on fast network computation, and the Boolean optimization is achieved by efficient ordered binary decision diagrams (OBDD) based upon implementation of functional decompositions.

Further, in an approach by Francis et. al. "Chortle: A Technology Mapping Program For Lookup Table-Based Field Programmable Gate Arrays," Proc. 27th ACM/IEEE Design Automation Conference, pp. 613–619, June 1990, a new algorithm has been discussed for technology mapping in which the method for choosing gate level decompositions based on bin packing is innovative.

Several other approaches have also been applied to achieve these objectives. However, all the methods mentioned above and many others either map a minimum number of logic elements or minimize a delay of the mapped circuit. There is no method that maps a design such that delay of the mapped circuit is minimum and the area is minimum under the delay.

Thus, it has been observed that there is a need to develop a technique that provides a method and device for packing a maximum number nodes in a single logic element while ensuring minimum delay.

SUMMARY OF THE INVENTION

An object of the invention is to overcome the above and other drawbacks of the prior art and provide a method for identifying the maximum volume and minimum cutset of the original network in a reliable and consistent manner.

To achieve the objective, the present invention provides an improved method for finding a maximum volume and minimum cutset in a network of interconnected nodes having a source node and at least one sink node, wherein the method comprises the following steps:

a. constructing a derived network for a given sink by replacing all nodes other than the source and sink by a set of first and second interconnected nodes connected by a single bridging edge such that the bridging edge connects the output of the first node to the input of the second node. The first node receives the inputs from previous nodes of the network, and the second node provides the outputs to the next nodes of the network;

b. assigning to each bridging edge a capacity of unity and to each non-bridging edge a capacity of infinity;

c. applying the augmenting path algorithm to identify all the distinct paths from the source node to a sink node;

d. identifying a member of the maximum volume and minimum cutset as the first saturated node encountered while traversing from the source to sink;

e. discarding the member nodes that have all the output nodes as members of the set;

f. checking if the feasible cutset is not achieved, then:
  i. constructing a reduced network by connecting the member of the cutset to the source directly;
  ii. repeating the steps c–f for the reduced network; and g. repeating steps a–f for each sink of the network.

The present instant invention further provides an improved method for optimally mapping a digital logic circuit over a minimum number of look-up tables (LUTs) in a programmable logic device while minimizing signal delay, wherein the method comprises the following steps:

a. constructing a network of interconnected nodes, each node depicting one or more circuit elements of the digital logic circuit;

b. constructing a derived network for a given sink by replacing all nodes other than the source and sink by a set of first and second interconnected nodes connected by a single bridging edge such that the bridging edge connects the output of a first node to the input of a second node. The first node receives the inputs from previous nodes of the network, and the second node provides the outputs to the next nodes of the network;

c. assigning to each bridging edge a capacity of unity and to each non-bridging edge a capacity of infinity;

d. applying the augmenting path algorithm to identify all the distinct paths from the source node to a sink node;

e. identifying a member of a maximum volume and minimum cutset as the first saturated node encountered while traversing from the source to the sink;

f. discarding those member nodes that have all the output nodes as members of the set;

g. checking if the feasible cutset is not achieved, then:
  i. constructing a reduced network by connecting the member of the cutset to the source directly;
  ii. repeating the steps k–n for the reduced network; and h. repeating steps i–o for each sink of the network.

BRIEF DESCRIPTION OF THE DRAWINGS

The invention will now be described with reference to the accompanying drawings.

DETAILED DESCRIPTION OF THE PREFERRED EMBODIMENTS

A person skilled in the art will appreciate that the following description of the present invention is illustrative only and is applicable to a variety of programmable logic arrays (PLAs) having logic elements/look-up tables (LUTs) of different sizes and is no way limiting to the discussed embodiments. Any such application of the invention will fall under the scope of the invention. Any application of the invention to other systems for which a networking problem can be reduced to a network of interconnected nodes will also fall under the scope of the invention.

Figure 1:
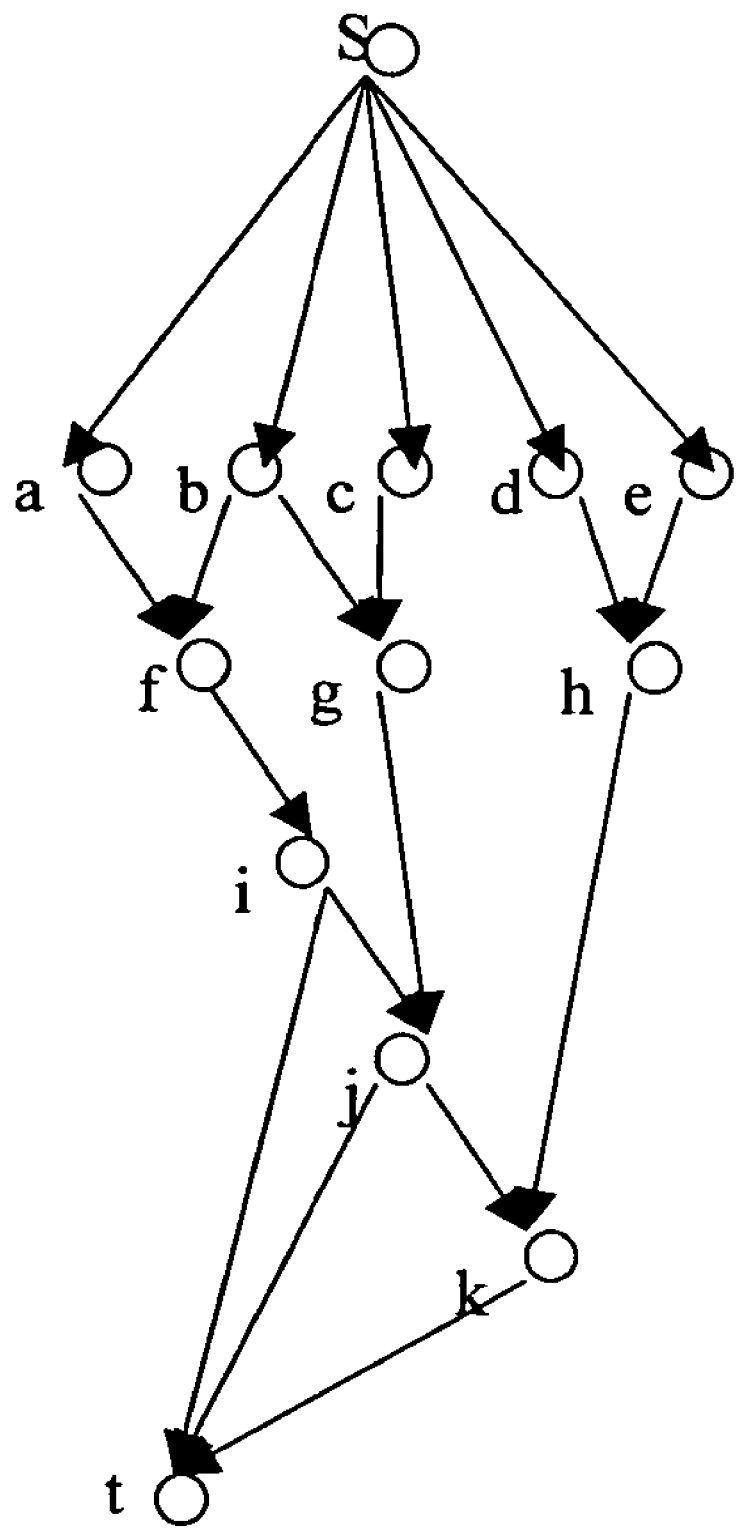
FIG. 1 shows a network of interconnected nodes in accordance with the present invention.

FIG. 1 shows a network of interconnected nodes having a source s and a sink t. The source s provides input to other intermediate nodes a, b, c, d, e that further connects the other intermediate nodes and the sink as shown.

Figure 2:
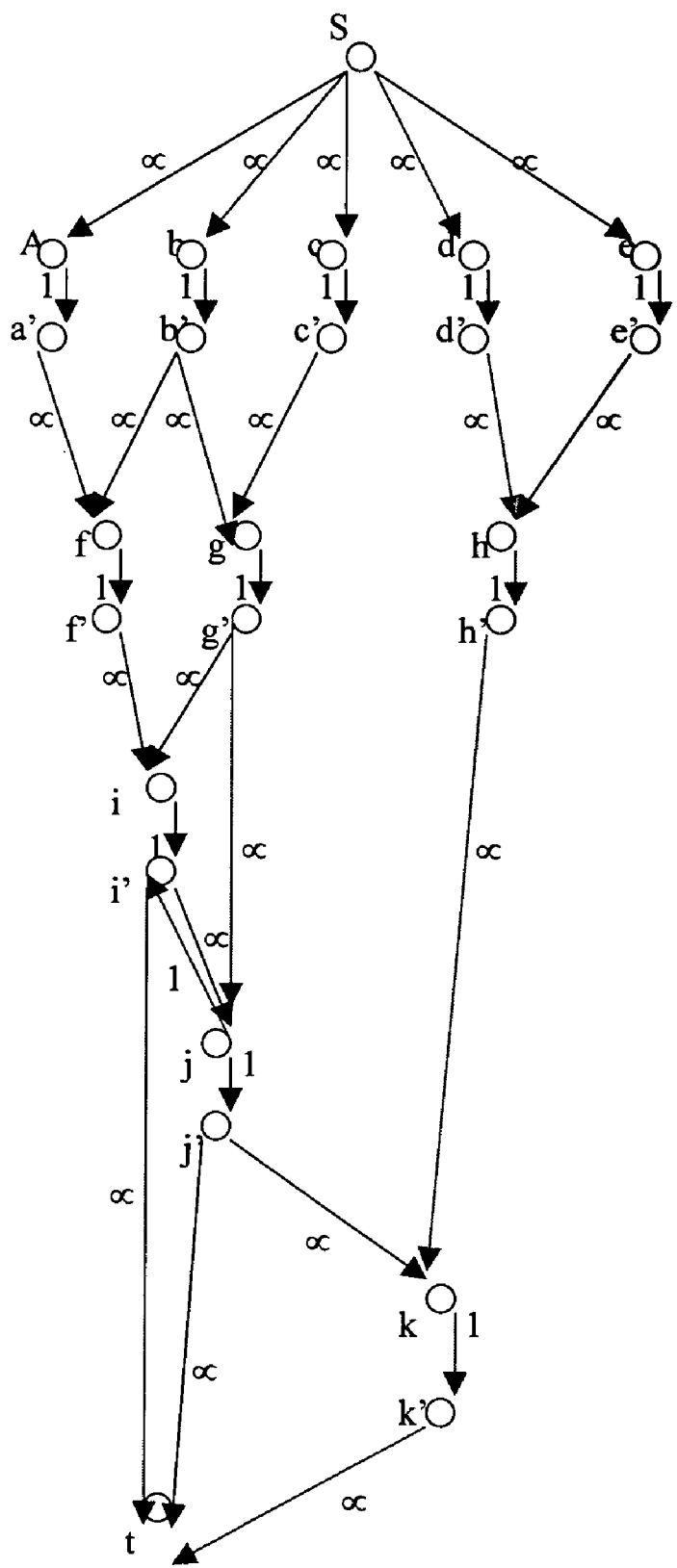
FIG. 2 shows a derived network of interconnected nodes in accordance with the present invention.

FIG. 2 shows a derived network of interconnected nodes from the network of FIG. 1. The derived network is obtained by replacing each intermediate node v by two nodes v, v' and connecting the nodes v, v' by an edge (v, v') referred as a bridging edge of capacity 1 and assigning capacity infinity to the rest of the edges. For the serially connected intermediate nodes u, v and w of the original network the connection in a derived network is such that the edge (u, v) is transformed into the edge (u', v) and the edge (v, w) transforms into (v', w).

All the possible distinct paths in the derived network by applying an augmenting path algorithm are found. Then a set of nodes providing a minimum cut is recognized by a cut finding algorithm. The cut finding algorithm identifies a member of the set as the first saturated node encountered while traversing from the source s to sink t. Further, if all output nodes of any member node of the set are also the member of the set then such a node is discarded from the set.

In the present example of FIG. 2 the following distinct paths are identified using an augmenting path algorithm:
P1=(s, a, a', f, f', t),
P2=(s, b, b', g, g', j, j', t),
P3=(s, d, d', h, h', k, k', t).

Figure 3:
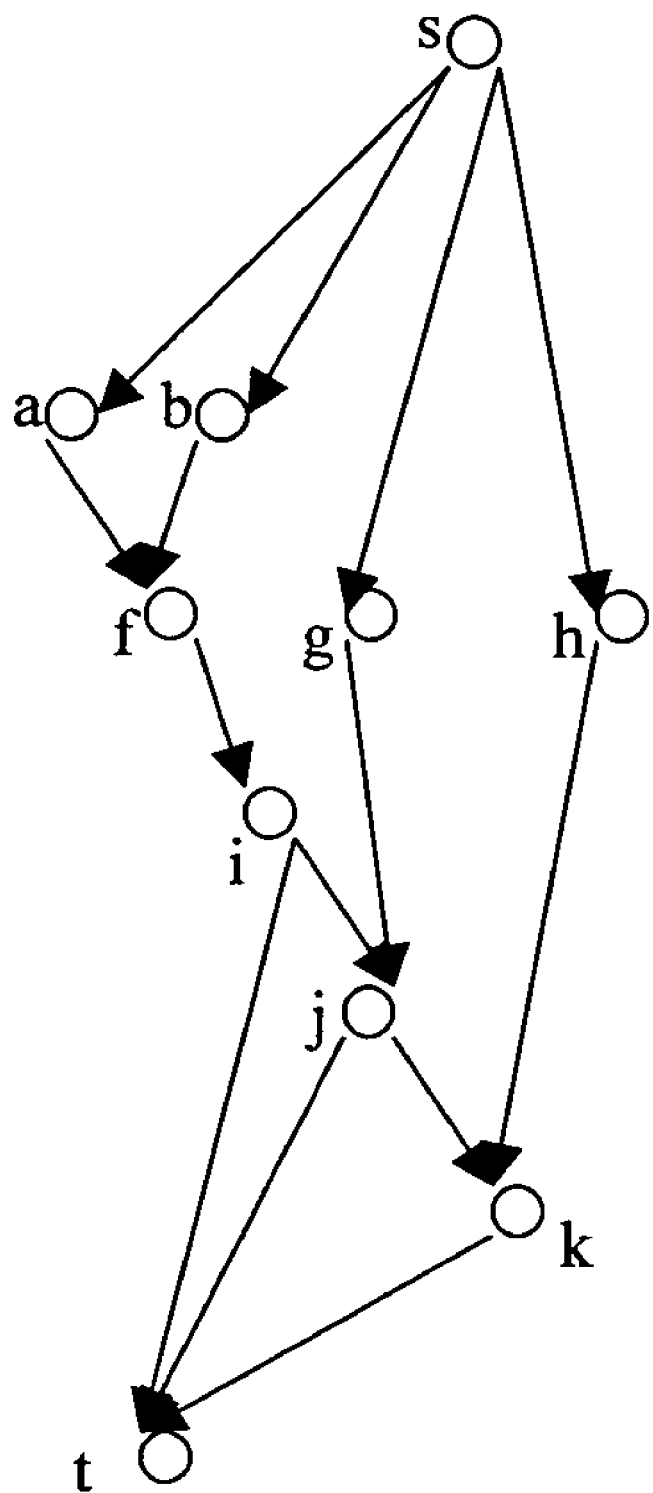
FIG. 3 shows a reduced network of interconnected nodes in accordance with the present invention.

For these three distinct paths a set of nodes providing a minimum cut can be determined using a cut finding algorithm as {a, b, g, h}, which is not a three feasible set. To reduce the set to a three feasible set insuring maximum volume and minimum delay, the present invention provides the following:

Step 1: A reduced network is constructed by connecting the nodes of the set-providing minimum cut directly to the source s; (as shown in FIG. 3);

Step 2: Applying the augmenting path algorithm and cut finding algorithm to the reduced network for determining a new set of nodes providing a minimum cut;

Step 3: Applying steps 1 and step 2 until a three feasible cut is found.

The example of FIG. 2 on applying the above algorithm provides a cutset {f, g, h}, which is the best cutset for the network as evident from the figure.

The following table compares results obtained for a LUT mapping using the conventional method and the instant invention.

TABLE 1

| Circuit | # of LUTs with proposed Technique | # of LUTs without Technique |
|---|---|---|
| 9sym | 11 | 13 |
| Alu2 | 416 | 421 |
| Apex7 | 146 | 159 |
| Apex6 | 413 | 420 |
| B12 | 490 | 514 |
| C499 | 74 | 74 |
| I6 | 183 | 183 |
| Misex3 | 2586 | 2661 |
| Rd73 | 253 | 263 |
| 5xpl | 98 | 99 |

TABLE 1-continued

| Circuit | # of LUTs with proposed Technique | # of LUTs without Technique |
|---|---|---|
| Count | 51 | 51 |
| Comp | 51 | 51 |

Further, the invention can also be realized for networks with more then one sink $t^1$, $t^2$, etc. by replicating separately the mapping for each sink to a different logic element. Furthermore, the cuts determined by this method can also be used for solving networking problems related to the system, such as telecommunication systems, traffic systems, computer networks, layouts, hydraulic systems, for example.

The invention claimed is:

1. A method for finding a maximum volume and minimum cutset in a network of interconnected nodes having a source node and at least one sink node, the method comprising:
   a. constructing a derived network for a given sink node by replacing all nodes other than the source and sink nodes by a set of first and second interconnected nodes connected by a single bridging edge such that a bridging edge connects an output of a first node to an input of a second node, the first node receiving inputs from previous nodes of the network, and the second node providing outputs to next nodes of the network;
   b. assigning to each bridging edge a capacity of unity and to each non-bridging edge a capacity of infinity;
   c. applying an augmenting path algorithm to identify all distinct paths from the source node to a sink node;
   d. identifying a member of a maximum volume and minimum cutset as a first saturated node encountered while traversing from the source node to the sink node;
   e. discarding those member nodes that have all the output nodes as members of the set;
   f. checking if a feasible cutset is not achieved, then
      i. constructing a reduced network by connecting the member of the cutset to the source node directly;
      ii. repeating the steps c–e for the reduced network; and
   g. repeating steps a–f for each sink node of the network.

2. A method for optimally mapping a digital logic circuit over a minimum number of look-up tables (LUTs) in a programmable logic device while minimizing signal delay, the method comprising:
   a. constructing a network of interconnected nodes, each node depicting one or more circuit elements of the digital logic circuit;
   b. constructing a derived network for a given sink node by replacing all nodes other than a source node and a sink node by a set of first and second interconnected nodes connected by a single bridging edge such that the bridging edge connects an output of a first node to an input of a second node, the first node receiving inputs from previous nodes of network, and the second node providing outputs to the next nodes of the network;
   c. assigning to each bridging edge a capacity of unity and to each non-bridging edge a capacity of infinity;
   d. applying the augmenting path algorithm to identify all the distinct paths from the source node to a sink node;
   e. identifying a member of a maximum volume minimum cutset as a first saturated node encountered while traversing from the source node to the sink node;
   f. discarding those member nodes that have all the output nodes as members of the set;
   g. checking if the feasible cutset is not achieved then
      i. constructing a reduced network by connecting the member of the cutset to the source directly;
      ii. repeating steps d–f for the reduced network and;
   h. repeating steps b–g for each sink node of the network.

* * * * *

UNITED STATES PATENT AND TRADEMARK OFFICE
CERTIFICATE OF CORRECTION

PATENT NO. : 7,188,328 B2 Page 1 of 1
APPLICATION NO. : 10/928627
DATED : March 6, 2007
INVENTOR(S) : Sharma et al.

It is certified that error appears in the above-identified patent and that said Letters Patent is hereby corrected as shown below:

Column 3, Line 16    Delete: "c-f"

Insert: -- c-e --

Column 3, Line 46    Delete: "k-n"

Insert: -- d-f --

Column 3, Line 47    Delete: "i-o"

Insert: -- b-g --

Signed and Sealed this

Seventh Day of August, 2007

JON W. DUDAS
*Director of the United States Patent and Trademark Office*